(12) United States Patent
Hirasawa et al.

(10) Patent No.: US 6,340,839 B1
(45) Date of Patent: Jan. 22, 2002

(54) HYBRID INTEGRATED CIRCUIT

(75) Inventors: Koki Hirasawa; Shingo Yanagihara, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/401,128

(22) Filed: Sep. 22, 1999

(30) Foreign Application Priority Data

Sep. 25, 1998 (JP) .......................................... 10-271815

(51) Int. Cl.[7] .......................................... H01L 23/495
(52) U.S. Cl. ...................... 257/672; 257/666; 257/676; 257/679; 257/686; 257/692; 257/698
(58) Field of Search ............................... 257/672, 679, 257/666, 676, 698, 692, 686; 361/784, 790

(56) References Cited

U.S. PATENT DOCUMENTS

| 5,070,258 A | * 12/1991 | Izumi et al. ................ 307/303 |
| 5,422,514 A | * 6/1995 | Griswold et al. ........... 257/679 |
| 5,498,901 A | * 3/1996 | Chillara et al. ............. 257/666 |
| 5,570,274 A | * 10/1996 | Saito et al. ................. 361/784 |
| 5,696,403 A | * 12/1997 | Rostoker et al. ............ 257/659 |
| 5,748,452 A | * 5/1998 | Londa ........................ 361/790 |
| 5,796,164 A | * 8/1998 | McGraw et al. ............ 257/723 |
| 5,963,490 A | * 10/1999 | Londa ........................ 361/790 |
| 6,222,274 B1 | * 4/2001 | Nishiura et al. ............ 257/776 |

FOREIGN PATENT DOCUMENTS

| JP | 60-136155 | 9/1985 |
| JP | 03-94461 | 4/1991 |
| JP | 05-326817 | 12/1993 |

* cited by examiner

Primary Examiner—Matthew Smith
Assistant Examiner—Belur V. Keshaven
(74) Attorney, Agent, or Firm—Sughrue Mion, PLLC

(57) ABSTRACT

A hybrid integrated circuit includes a metal lead frame, a wiring structure, an integrated circuit chip, and a lead. The wiring structure is comprised of a wiring layer formed on the upper surface of the lead frame through an insulating layer. The integrated circuit chip is arranged on the wiring structure and connected to a predetermined portion of the wiring structure. A terminal is arranged near the lead frame to be insulated and isolated from the lead frame and connected to the predetermined portion of the wiring structure. The insulating layer has an extending connecting portion extending from the wiring structure to be connected to the lead frame. A fixed potential is connected to the integrated circuit chip through the extending connecting portion and the lead frame.

11 Claims, 6 Drawing Sheets

HYBRID INTEGRATED CIRCUIT

BACKGROUND OF THE INVENTION

The present invention relates to a hybrid integrated circuit in which a plurality of integrated circuits are mounted.

In recent years, an increase in integration degree and operation speed of LSIs has been remarkably high, and multi-pin chips that operate at a clock frequency of 100 MHz or more have become commercially available. In a single chip-mounted package of such a high-speed chip, a delay in signal transmitted between the package and the printed circuit board is large, and the influence of parasitic capacitance or inductance of the package cannot be neglected in system design. Signal delay, and the influences of the parasitic capacitance and inductance, interfere with an increase in operation speed of the entire system.

In order to increase the operation speed of the system by solving the above problems, a technique called a hybrid integrated circuit (multi-chip module: MCM) is available. According to the MCM, chips are arranged as close as possible to each other to decrease signal delay between chips caused by the package, and the high operation speed of a single chip can be obtained even in a system composed of a plurality of chips.

FIG. 6 shows the arrangement of the MCM. The arrangement of the MCM will be described. A wiring layer 603 is formed on a die pad 601a on a lead frame 601 through an insulating layer 602, and an upper wiring layer 605 is formed on the wiring layer 603 through an interlevel insulating film 604. An integrated circuit chip 606 and a resistor chip 607 are mounted at predetermined positions on the upper wiring layer 605. The integrated circuit chip 606 is connected to predetermined portions of the upper wiring layer 605 through wires 608. The predetermined portions of the upper wiring layer 605 and leads 601b are connected to each other through wires 608a. The resultant lead frame 601 is encapsulated with a molding resin 609 with the distal ends of the leads 601b being exposed.

In the conventional MCM described above, the ground wiring layers to be connected to the respective hybrid-packaged integrated circuit chips are formed in the wiring layer 603 shown in FIG. 6. The ground wiring layers formed in the wiring layer 603 are connected to electrodes formed on the upper wiring layer 605 at portions close to the edge of the die pad 601a through the interlevel insulating film 604, and the electrodes are connected to predetermined leads by using wires.

In the wiring layer 603 formed with the ground wiring layers, a large number of wiring layers are naturally formed which pose a problem in connection of the ground wiring layers. Therefore, conventionally, the ground wiring layers described above must be bypassed in the wiring layer 603 in a very complicated manner, and the number of hybrid-packaged integrated circuit chips cannot accordingly be increased.

SUMMARY OF THE INVENTION

It is, therefore, an object of the present invention to further increase the integration degree of the MCM.

In order to achieve the above object, according to the present invention, there is provided a hybrid integrated circuit comprising a metal substrate, a wiring structure comprised of a wiring layer formed on an upper surface of the substrate through an insulating layer, an integrated circuit chip arranged on the wiring structure and connected to a predetermined portion of the wiring structure, and a terminal arranged near the substrate to be insulated and isolated from the substrate and connected to the predetermined portion of the wiring structure, wherein the insulating layer has an extending connecting portion extending from the wiring structure to be connected to the substrate, and a fixed potential is connected to the integrated circuit chip through the extending connecting portion and the substrate.

DESCRIPTION OF THE PREFERRED EMBODIMENTS

The preferred embodiments of the present invention will be described in detail with reference to the accompanying drawings.

First Embodiment

Figure 1A:
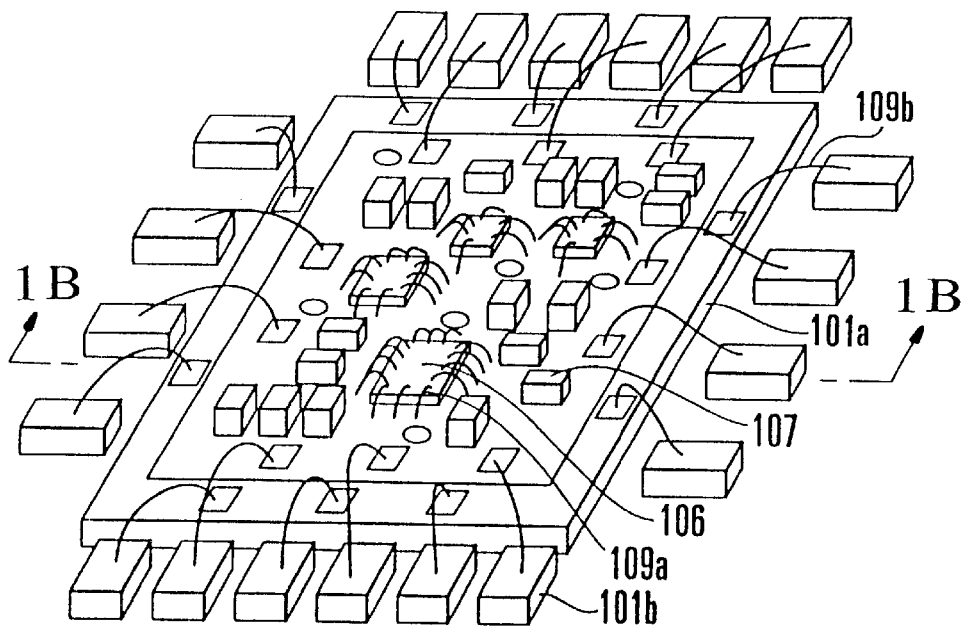
FIGS. 1A and 1B are perspective and sectional views, respectively, showing the schematic arrangement of a hybrid integrated circuit according to the first embodiment of the present invention.
Figure 1B:
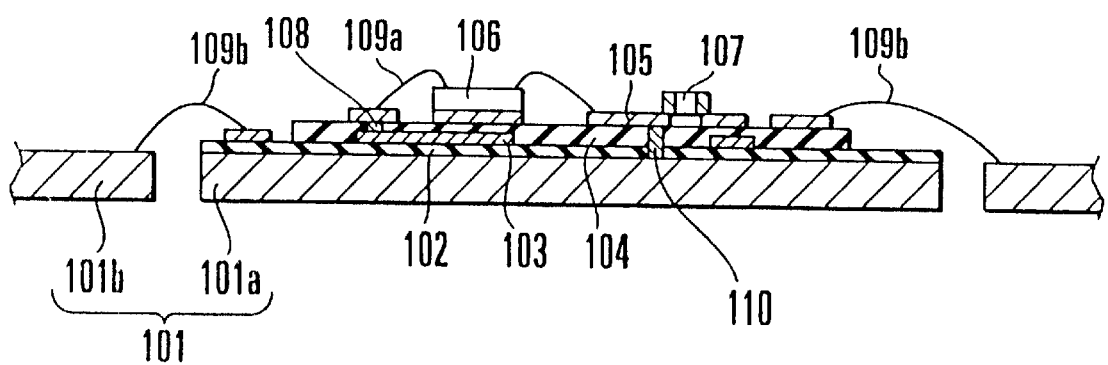

The first embodiment of the present invention will be described. FIGS. 1A and 1B show the schematic arrangement of a hybrid integrated circuit according to the first embodiment.

The hybrid integrated circuit according to the first embodiment will be described. First wiring layers 103 are formed on a die pad 101a of a lead frame 101 constituted by a metal plate through a lower insulating layer 102. Second wiring layers 105 are formed on some regions of the first wiring layers 103 through an interlevel insulating layer 104. Integrated circuit 5chips 106 and single chips 107 such as a resistor and a capacitor are arranged on a predetermined pattern of the second wiring layers 105.

The first and second wiring layers 103 and 105 are connected to each other at predetermined portions through extending connecting portions 108 formed in via holes extending through the interlevel insulating layer 104. The integrated circuit chips 106 and single chips 107 are connected to the electrodes of the second wiring layers 105 through wires 109a. Electrode pads of the first wiring layers 103 and electrodes pad(s) of the second wiring layers 105 are connected to leads 101b through wires 109b.

In the first embodiment, the ground potential of the respective integrated circuit chips 106 is connected to the die pad 101a through the extending connecting portions 110 formed in through holes extending through the lower insulating layer 102 and interlevel insulating layer 104. More specifically, connection is made in the order of the terminals for fixed potentials such as the ground potential of the integrated circuit chips 106—predetermined electrodes of the second wiring layers 105—the extending connecting portions 110—the die pad 101a. The fixed potentials such as the power supply potential to the respective integrated circuit chips 106 may be connected to the die pad 101a through the extending connecting portions 110, as described above.

Although not illustrated, the upper portion of the lead frame 101 including the integrated circuit chips 106, the wires 109a, and the like may be sealed with a molding resin. When the circuit forming portion and the like are encapsulated with the molding resin in this manner, the reliability of the hybrid integrated circuit can be increased.

As described above, according to the first embodiment, the fixed potentials such as the ground potential and the power supply potential are connected to the respective hybrid-packaged integrated circuit chips through the extending connecting portions 110 and die pad 101a. Therefore, in a wiring layer such as the first and second wiring layers 103 and 105, a bypass wiring pattern for connection of the fixed potentials need not be formed. As a result, in the first and second wiring layers 103 and 105, a larger region can be reserved for a wiring layer other than that to be connected to the fixed potentials, and the number of integrated circuit chips to be hybrid-packaged can be increased.

Second Embodiment

Figure 2A:
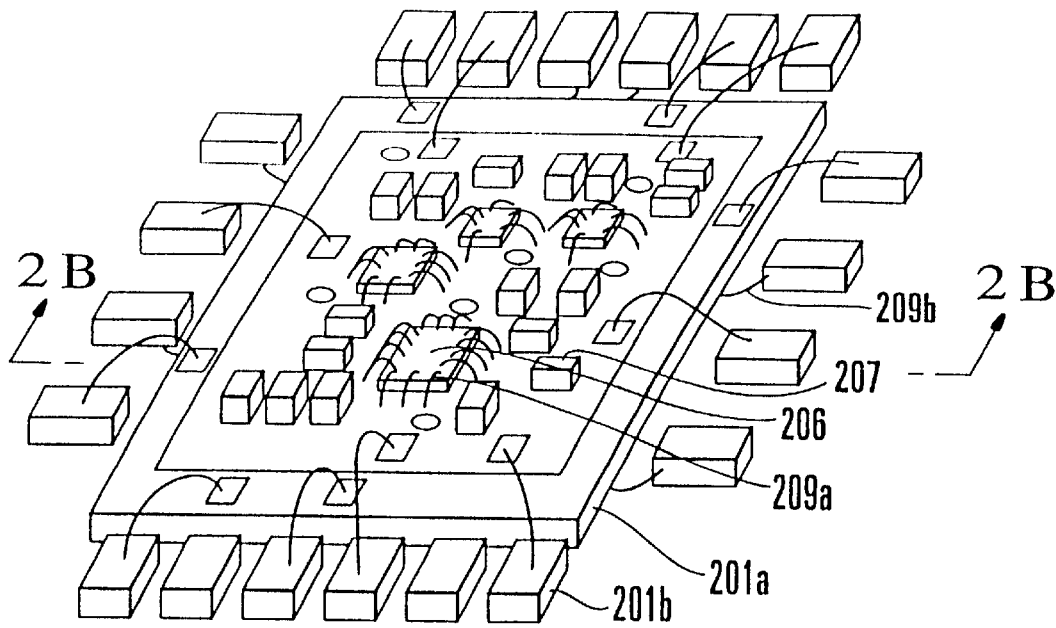
FIGS. 2A and 2B are perspective and sectional views, respectively, showing the schematic arrangement of a hybrid integrated circuit according to the second embodiment of the present invention.
Figure 2B:
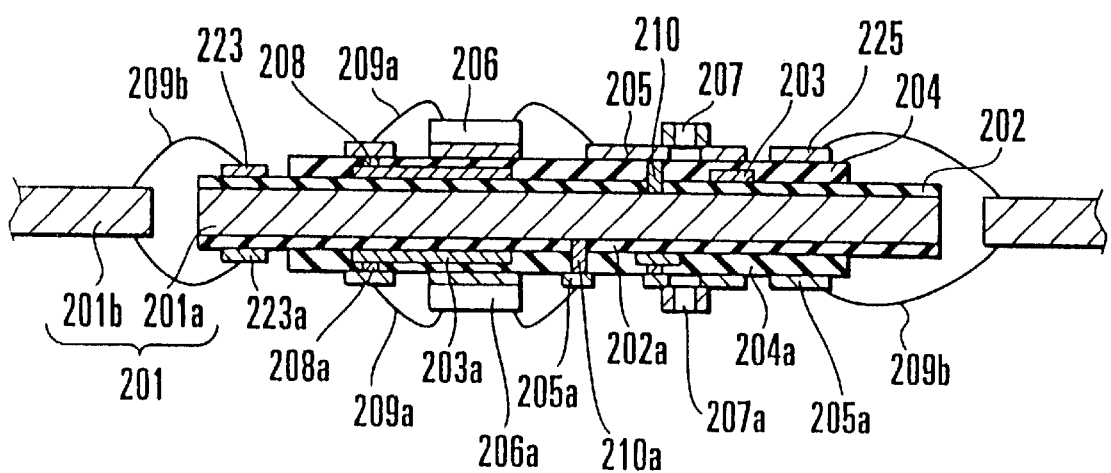

The second embodiment of the present invention will be described. FIGS. 2A and 2B show the schematic arrangement of a hybrid integrated circuit according to the second embodiment.

The hybrid integrated circuit according to the second embodiment will be described. First wiring layers 203 are formed on a die pad 201a of a lead frame 201 constituted by a metal plate through a lower insulating layer 202. Second wiring layers 205 are formed on some regions of the first wiring layers 203 through an interlevel insulating layer 204. Integrated circuit chips 206 and single chips 207 such as a resistor and a capacitor are arranged on a predetermined pattern of the second wiring layers 205.

In the second embodiment, first wiring layers 203a are also formed on the lower surface of the die pad 201a through a lower insulating layer 202a. Second wiring layers 205a are formed on some regions of the first wiring layers 203a through an interlevel insulating layer 204a. Integrated circuit chips 206a and single chips 207a such as a resistor and a capacitor are arranged on a predetermined pattern of the second wiring layers 205a, in the same manner as on the upper surface of the die pad 201a described above. More specifically, in the second embodiment, the integrated circuit chips are hybrid-packaged on the two surfaces of the lead frame 201.

In the same manner as in the first embodiment described above, the first and second wiring layers 203 and 205 are connected to each other at a predetermined portion through an extending connecting portion 208 formed in a via hole extending through the interlevel insulating layer 204. The integrated circuit chips 206 and single chips 207 are connected to the electrodes of the second wiring layers 205 through wires 209a, thus constituting a circuit. Electrode pads 223 of the first wiring layers 203 and electrode pads 225 of the second wiring layers 205 are connected to predetermined leads 201b through wires 209b.

Similarly, the first and second wiring layers 203a and 205a are connected to each other at a predetermined portion through an extending connecting portion 208a formed in a via hole extending through the interlevel insulating layer 204a. The integrated circuit chips 206a and single chips 207a are connected to the electrodes of the second wiring layers 205a through wires 209a, thus constituting a circuit. Electrode pads 223a of the first wiring layers 203a and electrode pads of the second wiring layers 205a are connected to the predetermined leads 201b through wires 209b. The wires 209b are not entirely illustrated in FIG. 2B.

In the second embodiment as well, fixed potentials such as the ground potential and the power supply potential are connected to the respective integrated circuit chips 206 through an extending connecting portion 210 formed in a through hole extending through the lower insulating layer 202 and interlevel insulating layer 204, and through the die pad 201a. Also, fixed potentials are connected to the respective integrated circuit chips 206a formed on the lower surface of the lead frame 201 through extending connecting portions 210a formed in through holes extending through the lower insulating layer 202a and interlevel insulating layer 204a, and through the die pad 201a. More specifically, connection is made in the order of the terminals for fixed potentials of the integrated circuit chips 206—predetermined electrodes of the second wiring layers 205—extending connecting portions 210—the die pad 201a. Similarly, another connection is made in the order of the terminals for fixed potentials of the integrated circuit chips 206a—predetermined electrodes of the second wiring layers 205a—the extending connecting portions 210a—the die pad 201a.

Although not illustrated, the upper portion of the lead frame 201 including the integrated circuit chips 206, the wires 209a, and the like may be sealed with a molding resin. When the circuit forming portion and the like are encapsulated with the molding resin in this manner, the reliability of the hybrid integrated circuit can be increased.

As described above, according to the second embodiment as well, the fixed potentials are connected to the respective hybrid-packaged integrated circuit chips through the die pad 201a. Therefore, in a wiring layer such as the first and second wiring layers 203 and 205, a bypass wiring pattern for connection of the fixed potentials such as the ground potential need not be formed. As a result, in the first and second wiring layers 203 and 205, and in the first and second wiring layers 203a and 205a, a larger region can be reserved for a wiring layer other than that to be connected to each fixed potential, and the number of integrated circuit chips to be hybrid-packaged can be increased.

Third Embodiment

Figure 3A:
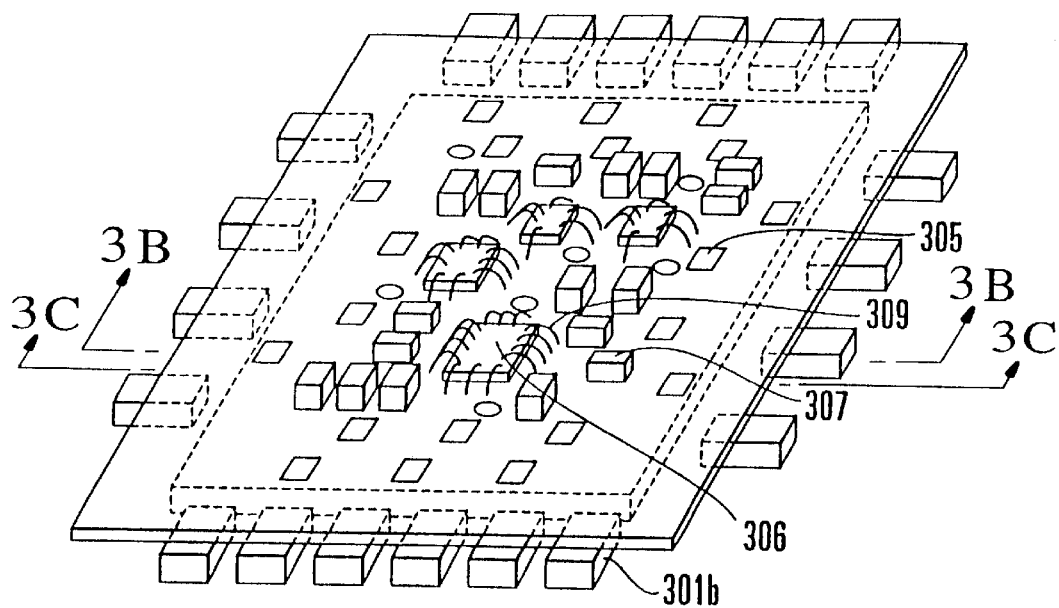
FIG. 3A and FIGS. 3B and 3C are perspective and sectional views, respectively, showing the schematic arrangement of a hybrid integrated circuit according to the third embodiment of the present invention.
Figure 3B:
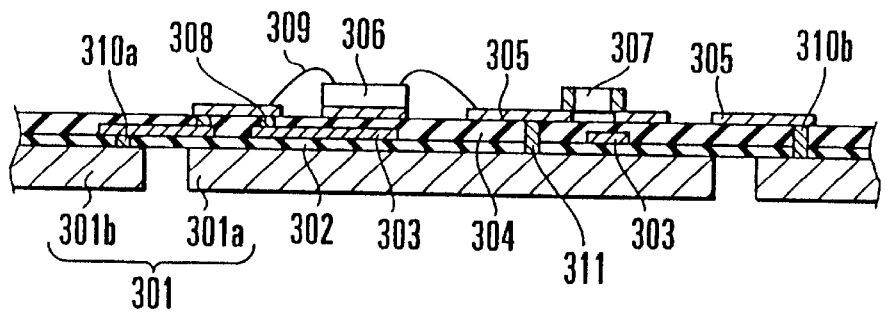
Figure 3C:
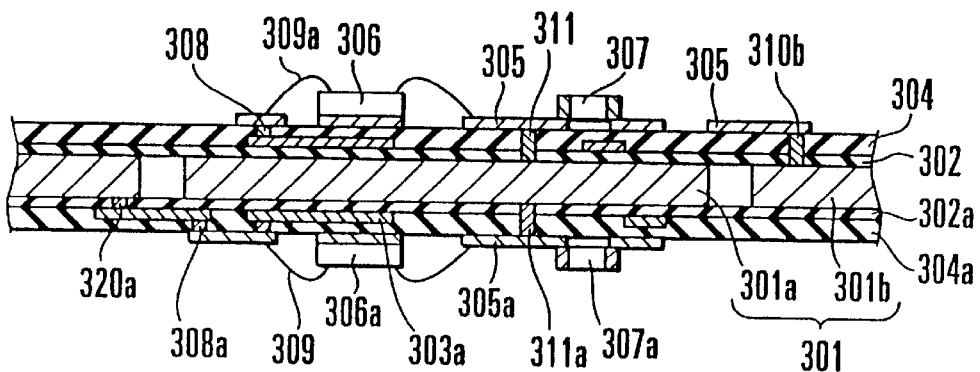

The third embodiment of the present invention will be described. FIGS. 3A to 3C show the schematic arrangement of a hybrid integrated circuit according to the third embodiment.

The hybrid integrated circuit according to the third embodiment will be described. First wiring layers 303 are formed on part of a lead frame 301 extending from a die pad 301a constituted by a metal plate to leads 301b, through a lower insulating layer 302. Second wiring layers 305 are formed on the first wiring layers 303 through an interlevel insulating layer 304. Integrated circuit chips 306 and single chips 307 such as a resistor and a capacitor are arranged on a predetermined pattern of the second wiring layers 305.

The first and second wiring layers 303 and 305 are connected to each other at predetermined portions through extending connecting portions 308 formed in via holes extending through the interlevel insulating layer 304. The integrated circuit chips 306 and single chips 307 are connected to the electrodes of the second wiring layers 305 through wires 309a, thus constituting a circuit. The first wiring layers 303 and predetermined leads 301b are connected to each other through extending connecting portions 310a formed in via holes in the lower insulating layer 302 extending onto these leads 301b. Similarly, the second wiring layers 305 and other predetermined leads 301b are connected to each other through extending connecting portions 310b formed in via holes extending through the lower insulating layer 302 extending onto these leads 301b, and the interlevel insulating layer 304.

In the third embodiment as well, fixed potentials such as the ground potential are connected to the respective integrated circuit chips 306 through extending connecting portions 311 formed in through holes extending through the lower insulating layer 302 and interlevel insulating layer 304, and through the die pad 301a. More specifically, connection is made in the order of the terminals for fixed potentials such as the ground potential of the integrated circuit chips 306—predetermined electrodes of the second wiring layers 305—the extending connecting portions 311—the die pad 301a.

Although not illustrated, the upper portion of the lead frame 301 including the integrated circuit chips 306, the wires 309, and the like may be sealed with a molding resin. When the circuit forming portion and the like are encapsulated with the molding resin in this manner, the reliability of the hybrid integrated circuit can be increased.

In this manner, the fixed potentials are connected to the respective hybrid-packaged integrated circuit chips through the die pad 301a. As a result, in a wiring layer such as the first and second wiring layers 303 and 305, a bypass wiring pattern for connection of the fixed potentials such as the ground potential and power supply potential need not be formed. As a result, in the first and second wiring layers 303 and 305, a larger region can be reserved for a wiring layer other than that to be connected to the fixed potentials such as the ground potential, and the number of integrated circuit chips to be hybrid-packaged can be increased.

In the third embodiment, the integrated circuit chips and the like are hybrid-packaged on one surface of the lead frame 301. However, the integrated circuit chips can be hybrid-packaged on the two surfaces of the lead frame, in the same manner as in the second embodiment described above.

More specifically, as shown in FIG. 3C, first wiring layers 303a may also be formed on the lower surface of the die pad 301a through a lower insulating layer 302a. Second wiring layers 305a may be formed on the first wiring layers 303a through an interlevel insulating layer 304a. Integrated circuit chips 306a and single chips 307a such as a resistor and a capacitor may be arranged on a predetermined pattern of the second wiring layers 305a, in the same manner as on the upper surface of the die pad 301a described above.

The first and second wiring layers 303a and 305a may be connected to each other at predetermined portions through extending connecting portions 308a formed in via holes extending through the interlevel insulating layer 304a. The integrated circuit chips 306a and single chips 307a may be connected to the electrodes of the second wiring layers 305a through wires 309. The first wiring layers 303a are connected to predetermined leads 301b through extending connecting portions 320a formed in via holes of the lower insulating layer 302a extending onto these leads 301b. Fixed potentials such as the ground potential may be connected to the respective integrated circuit chips 306a through extending connecting portions 311a formed in through holes extending through the lower insulating layer 302a and interlevel insulating layer 304a, and through the die pad 301a.

Fourth Embodiment

Figure 4A:
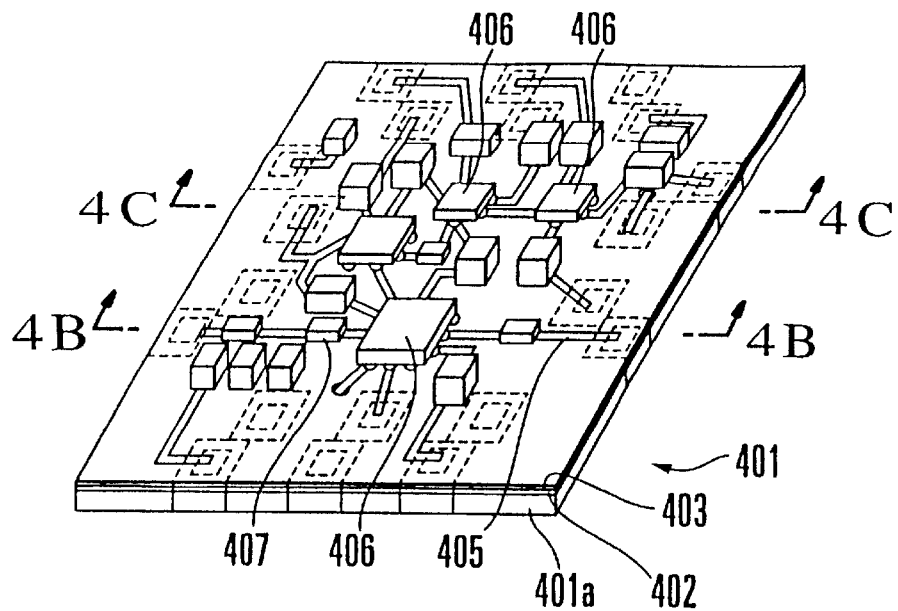
FIG. 4A and FIGS. 4B and 4C are perspective and sectional views, respectively, showing the schematic arrangement of a hybrid integrated circuit according to the fourth embodiment of the present invention.
Figure 4B:
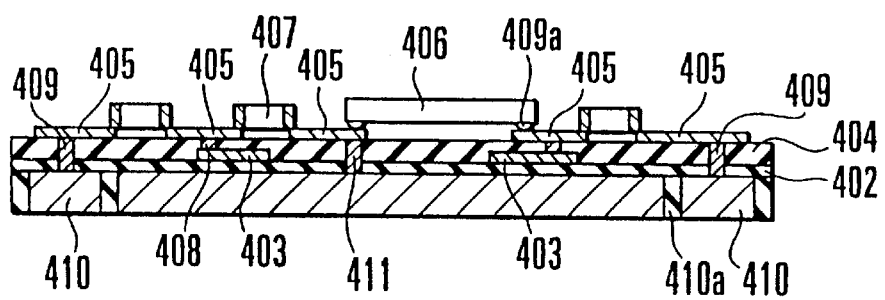
Figure 4C:
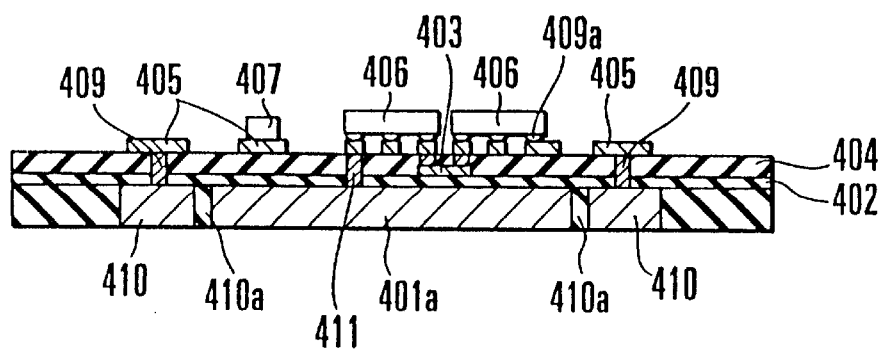

The fourth embodiment of the present invention will be described. FIGS. 4A to 4C show the schematic arrangement of a hybrid integrated circuit according to the fourth embodiment.

The hybrid integrated circuit according to the fourth embodiment will be described. First wiring layers 403 are formed on a die pad 401a of a lead frame 401 constituted by a metal plate through a lower insulating layer 402. Second wiring layers 405 are formed on the first wiring layers 403 through an interlevel insulating layer 404. Integrated circuit chips 406 and single chips 407 such as a resistor and a capacitor are arranged on a predetermined pattern of the second wiring layers 405.

The first and second wiring layers 403 and 405 are connected to each other at predetermined portions through extending connecting portions 408 formed in via holes extending through the interlevel insulating layer 404. The integrated circuit chips 406 and single chips 407 are connected to the electrodes of the second wiring layers 405. The integrated circuit chips 406 are connected to the second wiring layers 405 through bumps 409a, thus constituting a circuit.

In the hybrid integrated circuit according to the fourth embodiment, the second wiring layers 405 are connected to terminals 410 at portions extending near the die pad 401a, through extending connecting portions 409 formed in through holes extending through the lower insulating layer 402 and interlevel insulating layer 404. The terminals 410 are insulated and isolated from the die pad 401a by an insulating film 410a.

In the fourth embodiment, fixed potentials such as the ground potential are connected to the respective integrated circuit chips 406 through extending connecting portions 411 formed in through holes extending through the lower insulating layer 402 and interlevel insulating layer 404, and through the die pad 401a. More specifically, connection is made in the order of the terminals for fixed potentials such as the ground potential of the integrated circuit chips 406—predetermined electrodes of the second wiring layers 405—the extending connecting portions 411—the die pad 401a.

In this manner, the fixed potentials are connected to the respective hybrid-packaged integrated circuit chips through the die pad 401a. Therefore, in a wiring layer such as the first and second wiring layers 403 and 405, a bypass wiring pattern for connection of the fixed potentials such as the ground potential and power supply potential need not be formed. As a result, in the first and second wiring layers 403 and 405, a larger wiring region other than that to be connected to each fixed potential can be reserved, and the number of integrated circuit chips to be hybrid-packaged can be increased.

In the fourth embodiment, as described above, the region of the die pad 401a of the lead frame 401 is provided with the terminals 410 insulated and isolated from the die pad 401a. More specifically, according to the fourth embodiment, the ball-like bumps formed on the terminals 410 enable packaging on the lower surface of the lead frame 401, so that the packaging area of the MCM can be reduced.

The terminals 410 are formed to be completely separated from the lead frame 401. During the manufacturing process of the MCM of the fourth embodiment, the MCM can be checked even if the lead frame 401 is not separate from the frame.

Fifth Embodiment

Figure 5A:
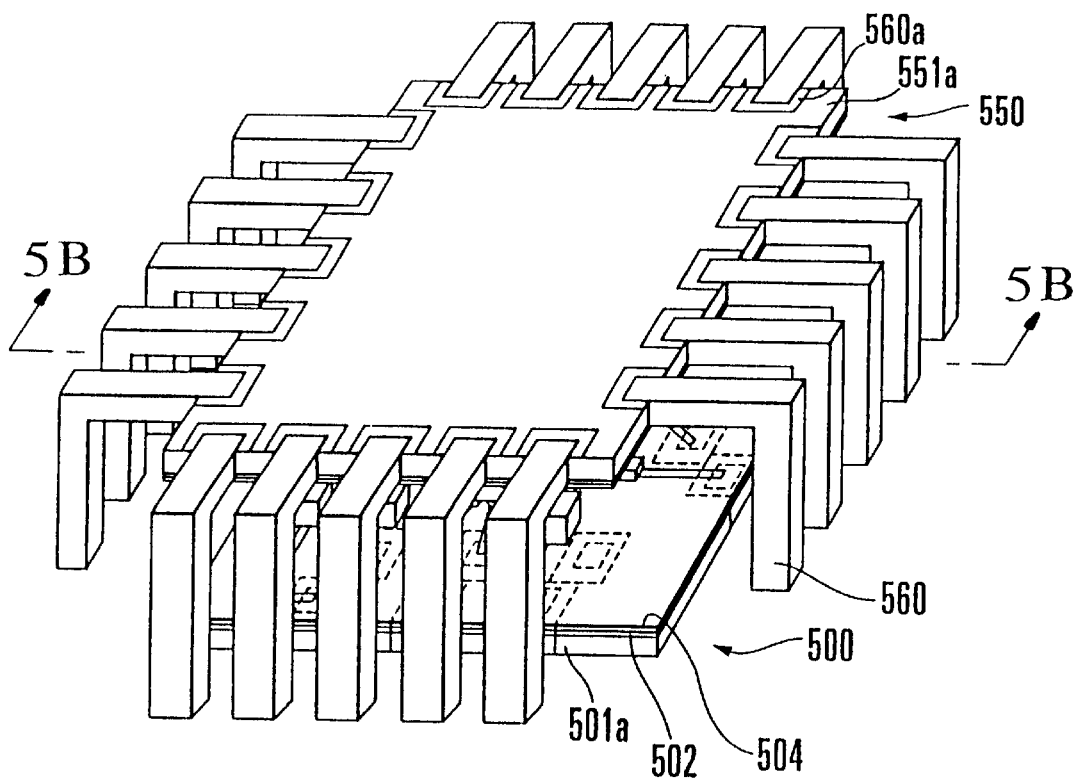
FIGS. 5A and 5B are perspective and sectional views, respectively, showing the schematic arrangement of a hybrid integrated circuit according to the fifth embodiment of the present invention.
Figure 5B:
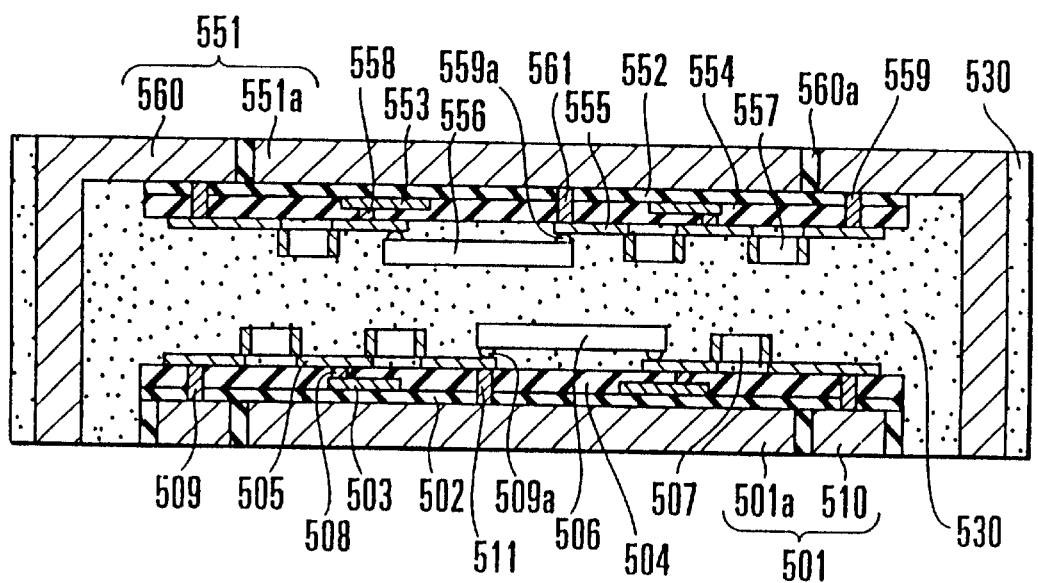
Figure 6:
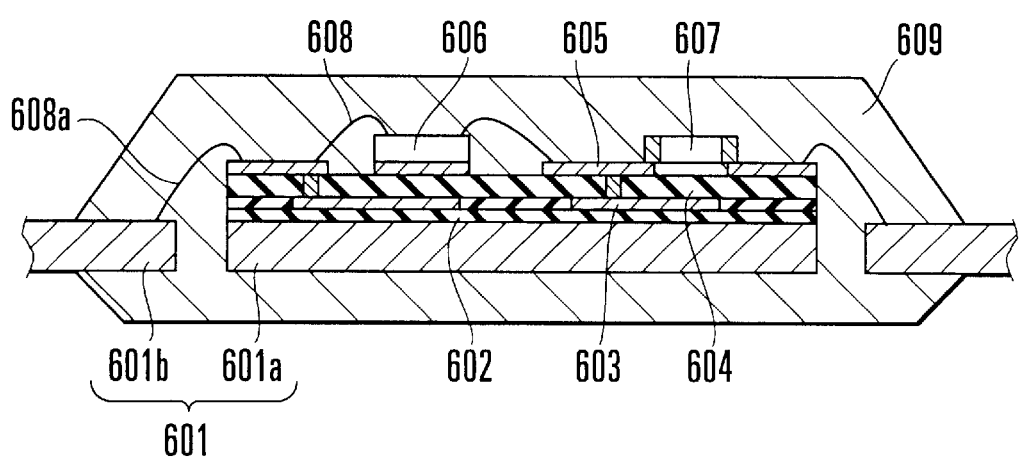
FIG. 6 is a sectional view showing the arrangement of a conventional MCM.

The fifth embodiment of the present invention will be described. FIGS. 5A and 5B show the schematic arrangement of a hybrid integrated circuit according to the fifth embodiment. In the fifth embodiment, two MCMs (hybrid integrated circuits) each obtained in the fourth embodiment described above are arranged such that their chip mounting surfaces oppose each other.

The hybrid integrated circuit according to the fifth embodiment will be described. This integrated circuit is constituted by an MCM 500 having almost the same arrangement as that of the fourth embodiment, and an MCM 550 having extended terminals.

In the MCM 500, first wiring layers 503 are formed on a die pad 501a constituted by a metal plate through a lower insulating layer 502. Second wiring layers 505 are formed on the first wiring layers 503 through an interlevel insulating layer 504. Integrated circuit chips 506 and single chips 507 such as a resistor and a capacitor are arranged on a predetermined pattern of the second wiring layers 505.

The first and second wiring layers 503 and 505 are connected to each other at predetermined portions through extending connecting portions 508 formed in via holes extending through the interlevel insulating layer 504. The integrated circuit chips 506 and single chips 507 are connected to the electrodes of the second wiring layers 505. The integrated circuit chips 506 are connected to the second wiring layers 505 through bumps 509a, thus constituting a circuit.

In this MCM 500, the second wiring layers 505 are connected to terminals 510 at portions where they extend to near the die pad 501a, through extending connecting portions 509 formed in through holes extending through the lower insulating layer 502 and interlevel insulating layer 504. The terminals 510 are arranged on the die pad 501a of a lead frame 501 to be insulated and isolated from the die pad 501a by an insulating film.

The above arrangement is almost identical to that of the fourth embodiment described above.

In the MCM 550, first wiring layers 553 are formed on a die pad 551a constituted by a metal plate through a lower insulating layer 552. Second wiring layers 555 are formed on the first wiring layers 553 through an interlevel insulating layer 554. Integrated circuit chips 556 and single chips 557 such as a resistor and a capacitor are arranged on a predetermined pattern of the second wiring layers 555.

The first and second wiring layers 553 and 555 are connected to each other at predetermined portions through extending connecting portions 558 formed in via holes extending through the interlevel insulating layer 554. The integrated circuit chips 556 and single chips 557 are connected to the electrodes of the second wiring layers 555. The integrated circuit chips 556 are connected to the second wiring layers 555 through bumps 559a, thus constituting a circuit.

In this MCM 550, the second wiring layers 555 are connected to extended terminals 560 at portions where they extend near the die pad 551a, through extending connecting portions 559 formed in through holes extending through the lower insulating layer 552 and interlevel insulating layer 554. The extended terminals 560 are arranged on the die pad 551a of a lead frame 551 to be insulated and isolated from the die pad 551a by an insulating film 560a.

In the fifth embodiment, fixed potentials are connected to the respective integrated circuit chips 506 through extending connecting portions 511 formed in through holes extending through the lower insulating layer 502 and interlevel insulating layer 504, and through the die pad 501a. More specifically, connection is made in the order of the terminals for fixed potentials such as the ground potential of the integrated circuit chips 506—predetermined electrodes of the second wiring layers 505—the extending connecting portions 511—the die pad 501a.

Similarly, fixed potentials are connected to the respective integrated circuit chips 556 through extending connecting portions 561 formed in through holes extending through the lower insulating layer 552 and interlevel insulating layer 554, and through the die pad 551a. More specifically, connection is made in the order of the terminals for fixed potentials such as the ground potential of the integrated circuit chips 556—predetermined electrodes of the second wiring layers 555—the extending connecting portions 561—the die pad 551a.

In this manner, the fixed potentials such as the ground potential are connected from the respective hybrid-packaged integrated circuit chips through the die pads 501a and 551a. Therefore, in a wiring layer such as the first and second wiring layers 503 and 505, a bypass wiring layer for connection of the fixed potentials such as the ground potential need not be formed. As a result, in the first and second wiring layers 503 and 505, and in the first wiring layer 553 and second wiring layer 555, a larger wiring region other than that to be connected to each fixed potential can be reserved, and the number of integrated circuit chips to be hybrid-packaged can be increased.

In the fifth embodiment, as described above, the terminals 510 insulated and isolated from the die pad 501a are provided to the lower surface of the die pad 501a of the lead frame 501. Also, the extended terminals 560 insulated and isolated from the die pad 551a are provided to the lower surface of the die pad 551a of the lead frame 551. The lead frames 501 and 551 are closely arranged such that their chip mounting surfaces oppose each other, and are encapsulated with a resin 530 by molding. The extended terminals 560 are extended as far as to the lower surface of the lead frame 501, and the ends of the extended terminals 560 and the terminals 510 are both exposed to the lower surface of the lead frame 501.

As a result, according to the fifth embodiment, the ball-like bumps formed on the terminals 510 and on the ends of the extended terminals 560 enable packaging on the lower surface of the lead frame 501, so that the packaging area of the MCM can be reduced.

As has been described above, according to the present invention, there is provided a hybrid integrated circuit comprising a metal substrate, a wiring structure comprised of a wiring layer formed on an upper surface of the substrate through an insulating layer, an integrated circuit chip arranged on the wiring structure and connected to a predetermined portion of the wiring structure, and a terminal arranged near the substrate to be insulated and isolated from the substrate and connected to the predetermined portion of the wiring structure, wherein the insulating layer has an extending connecting portion extending from the wiring structure to be connected to the substrate, and fixed potentials are connected to the integrated circuit chip through the extending connecting portion and the substrate.

There is also provided a hybrid integrated circuit comprising a metal substrate, a wiring structure arranged on an upper surface of the substrate and comprised of a plurality of insulating layers and a plurality of wiring layers respectively formed on the plurality of wiring layers, an integrated circuit chip arranged on the wiring structure and connected to a predetermined portion of the wiring structure, and a terminal arranged near the substrate to be insulated and isolated from the substrate and connected to the predetermined portion of the wiring structure, wherein the wiring structure has an extending connecting portion to be connected to the substrate, and fixed potentials are connected to the integrated circuit chip through the extending connecting portion and the substrate.

According to the present invention, the substrate serves as the terminal of the fixed potential. When an extending through portion is formed immediately under a region where the integrated circuit chip is to be arranged, a wiring pattern for the fixed potential need not be formed in the wiring layer. As a result, according to the present invention, the integration degree of the wiring layer can be improved, and the integration degree of the MCM can accordingly be further improved.

What is claimed is:

1. A hybrid integrated circuit comprising:
   a metal substrate;
   a wiring structure comprised of a wiring layer formed on an upper surface of said substrate through an insulating layer;
   an integrated circuit chip arranged on said wiring structure and connected to a predetermined portion of said wiring structure; and
   a terminal arranged near said substrate to be insulated and isolated from said substrate and connected to said predetermined portion of said wiring structure, wherein
   said insulating layer has an extending connecting portion extending from said wiring structure to be connected to said substrate, and
   a fixed potential is connected to said integrated circuit chip through said extending connecting portion and said substrate.

2. A circuit according to claim 1, wherein said extending connecting portion is arranged under said integrated circuit chip.

3. A circuit according to claim 1, wherein said wiring structure is stacked in a plurality of layers to form a multilayered wiring structure, and said integrated circuit chip is arranged on said multilayered wiring structure.

4. A circuit according to claim 1, wherein said wiring structure and said integrated circuit chip are arranged on a lower surface of said substrate as well as on said upper surface of said substrate.

5. A circuit according to claim 1, wherein two substrates each having said wiring structure and said integrated circuit chip are arranged such that surfaces thereof where said integrated circuit chips are formed oppose each other.

6. A circuit according to claim 1, wherein said terminal is connected to said predetermined portion of said wiring structure through a bonding wire.

7. A circuit according to claim 1, wherein said terminal is formed separately from said substrate to come into contact with an insulating layer in contact with said substrate.

8. A hybrid integrated circuit comprising:
   a metal substrate;
   a wiring structure arranged on an upper surface of said substrate and comprised of a plurality of insulating layers and a plurality of wiring layers;
   an integrated circuit chip arranged on said wiring structure and connected to a predetermined portion of said wiring structure; and
   a terminal arranged near said substrate to be insulated and isolated from said substrate and connected to said predetermined portion of said wiring structure, wherein
   said wiring structure has an extending connecting portion to be connected to said substrate, and
   a fixed potential is connected to said integrated circuit chip through said extending connecting portion and said substrate.

9. A circuit according to claim 8, wherein said terminal is connected to said predetermined portion of said wiring structure through a bonding wire.

10. A circuit according to claim 8, wherein said terminal is formed separately from said substrate to come into contact with an insulating layer in contact with said substrate.

11. A circuit according to claim 10, wherein said terminal and said substrate are separate from each other through an insulating film.

* * * * *